United States Patent
Tao et al.

Patent Number: 6,165,881
Date of Patent: Dec. 26, 2000

[54] METHOD OF FORMING SALICIDE POLY GATE WITH THIN GATE OXIDE AND ULTRA NARROW GATE WIDTH

[75] Inventors: Hun-Jan Tao; Chia-Shiung Tsai, both of Hsin-Chu, Taiwan

[73] Assignee: Taiwan Semiconductor Manufacturing Company, Hsin-Chu, Taiwan

[21] Appl. No.: 09/177,185

[22] Filed: Oct. 23, 1998

[51] Int. Cl.[7] ............................................... H01L 21/4763
[52] U.S. Cl. ........................................... 438/592; 438/592
[58] Field of Search ................................... 438/669, 656, 438/671, 696, 735, 740, 691, 692, 592, 593; 205/656

[56] References Cited

U.S. PATENT DOCUMENTS

| | | |
|---|---|---|
| 4,657,628 | 4/1987 | Holloway et al. .................. 156/643 |
| 5,061,647 | 10/1991 | Roth et al. ............................. 438/696 |
| 5,372,673 | 12/1994 | Stager et al. ......................... 156/626 |
| 5,431,770 | 7/1995 | Lee et al. ............................. 156/653.1 |
| 5,837,588 | 11/1998 | Wu ........................................ 438/671 |
| 5,968,336 | 10/1999 | Rolferson ............................. 205/656 |
| 5,985,761 | 11/1999 | Sparks et al. ......................... 438/669 |

*Primary Examiner*—David Nelms
*Assistant Examiner*—Dung A Le
*Attorney, Agent, or Firm*—George O. Saile; Stephen B. Ackerman

[57] ABSTRACT

I A method is achieved for removing a hardmask from a feature on a semiconductor wafer. The method comprises the following phases: depositing a buffer layer overall; etching back the buffer layer in an etching apparatus to expose the hardmask; etching the hardmask in the etching apparatus; and etching of the remaining buffer layer in the etching apparatus.

29 Claims, 3 Drawing Sheets

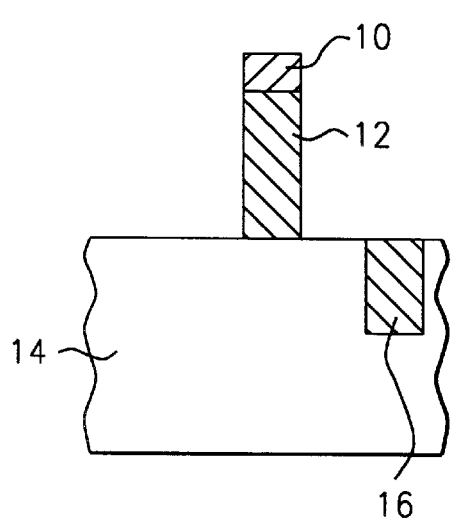
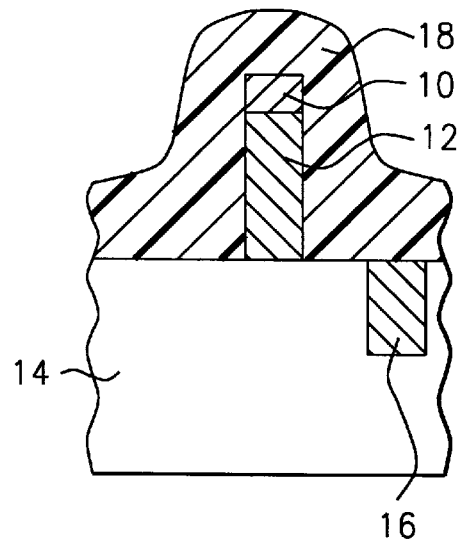
FIG. 1A    FIG. 1B
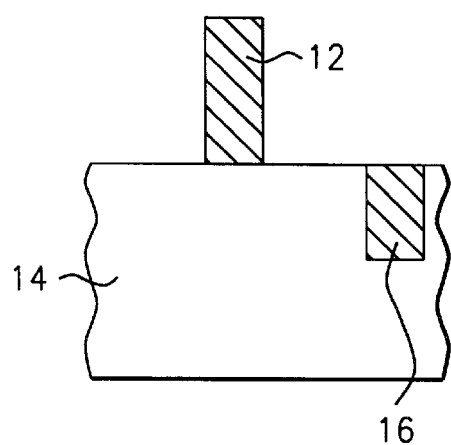
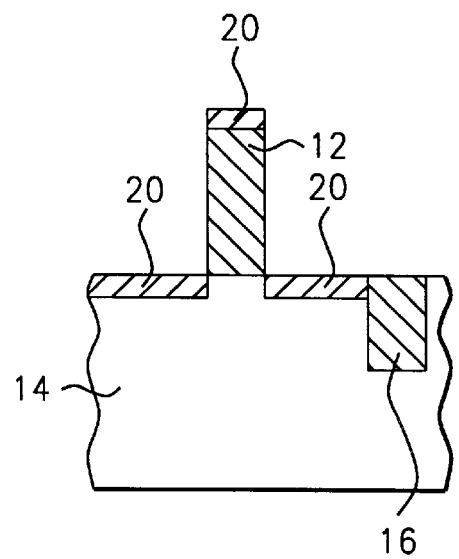
FIG. 1C    FIG. 1D

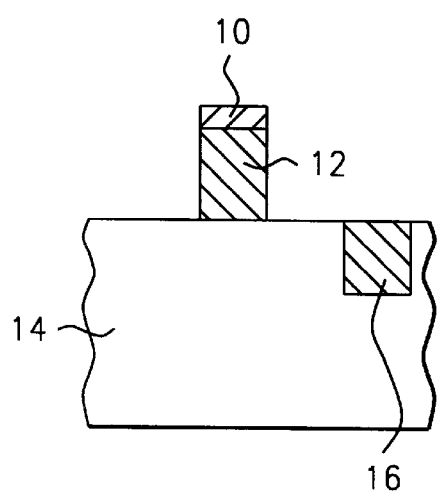
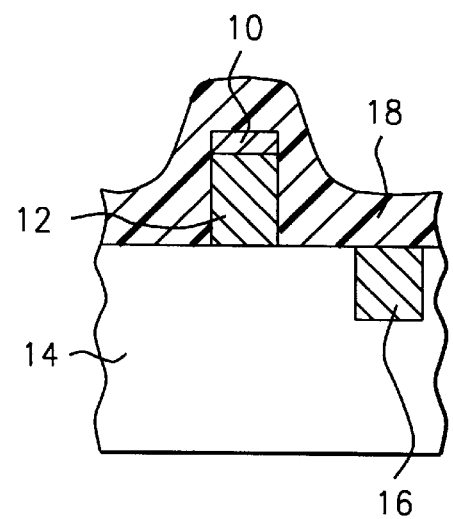
FIG. 2A - Prior Art
FIG. 2B - Prior Art
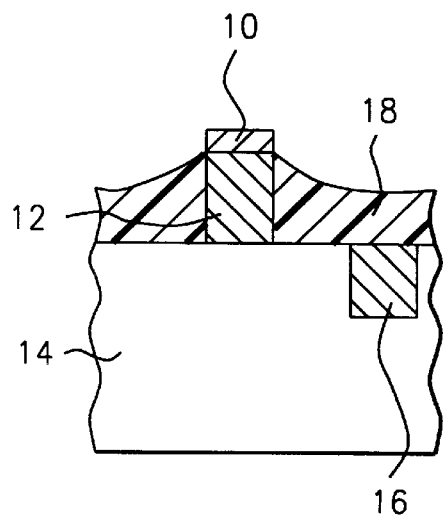
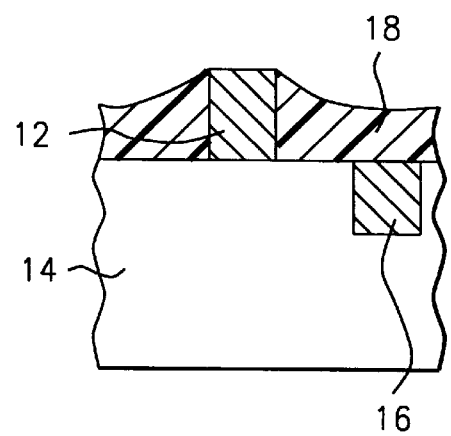
FIG. 2C - Prior Art
FIG. 2D - Prior Art

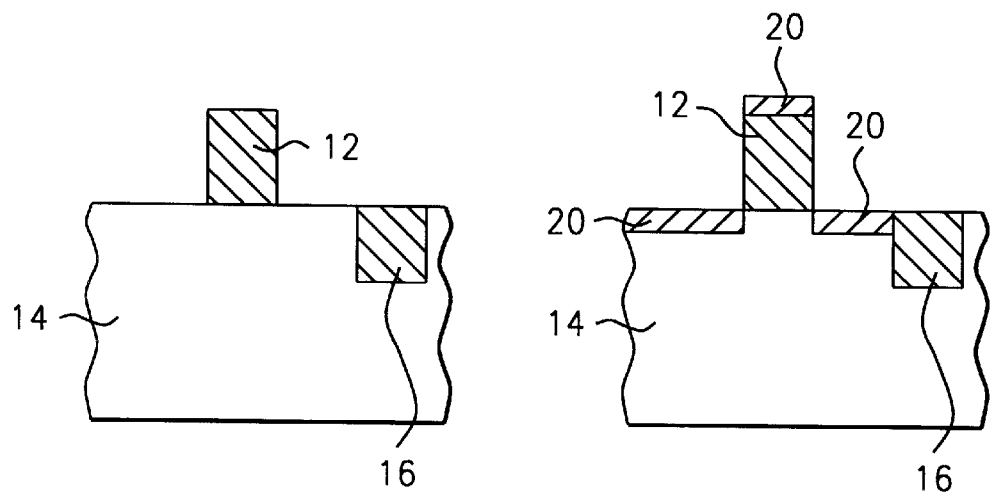
FIG. 2E – Prior Art   FIG. 2F – Prior Art
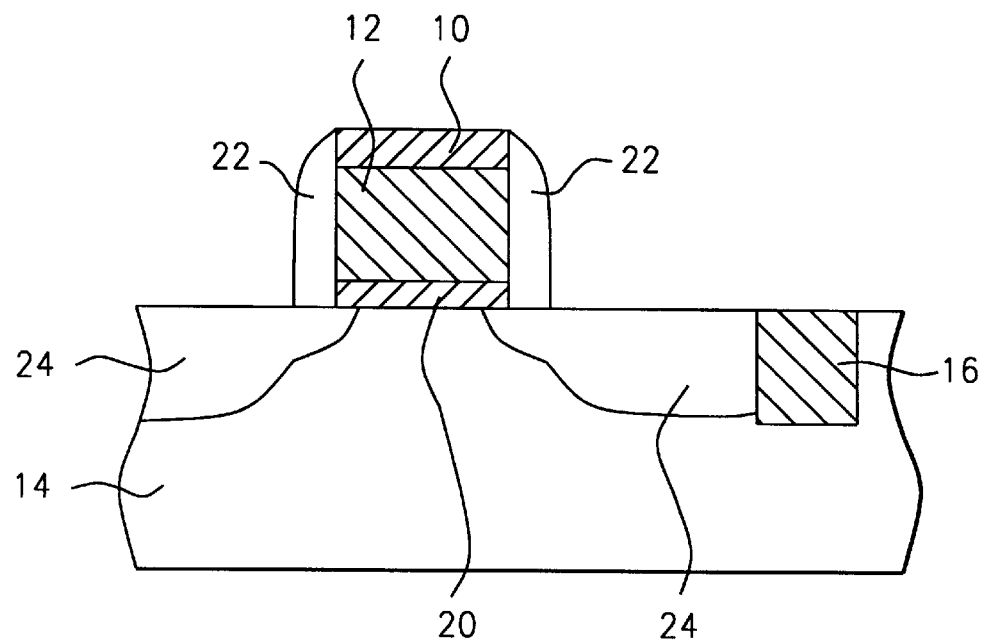
FIG. 3

METHOD OF FORMING SALICIDE POLY GATE WITH THIN GATE OXIDE AND ULTRA NARROW GATE WIDTH

BACKGROUND OF THE INVENTION (1) Field of the Invention

The present invention relates to semiconductor integrated Circuit processing, and more particularly, to etching processes compatible with ULSI technology.

(2) Description of Prior Art

The salicide (self-aligned silicide) process is an integral part of ULSI technology. In this process a metallic layer, titanium or cobalt, is deposited over the entire wafer and heated in a nitrogen environment, so that silicide is formed in regions where the metal is in contact with silicon. These could be exposed source and drain regions and bare surfaces of polysilicon gates and lines. The unreacted metal is removed by an etchant that does not attack silicide, silicon or oxide. Thus a silicide layer can be patterned without a masking step.

A process for patterning local interconnections based on the salicide process is described in U.S. Pat. No. 4,657,628 to Holloway et. al. Using titanium as the metal, a layer of titanium silicide is formed where silicon was left exposed. Instead of removing the unreacted metal, a hardmask is deposited and patterned over the titanium. A conductive titanium nitride layer formed subsequently will be patterned according to the hardmask. Alternatively, the patterning step could precede formation of the titanium nitride.

In U.S. Pat. No. 555,431,770 to Lee et, al. a method of forming features, gates or lines for example, with sublithographic dimensions is disclosed. A hardmask is patterned over layers of oxide or polysilicon, for example. The dimension of the hardmask is reduced by an isotropic etch. An ensuing anisotropic etch will produce a feature of smaller dimension than the original mask.

A planarization technique involving a buffer layer is disclosed in U.S. Pat. No. 5,372,673 to Stager et. al. A buffer layer is applied so that its surface is more planer than the surface it covers. By appropriately monitoring and altering the etch process, the surface of the original layer can be made relatively planar.

The present invention is particularly relevant to situations in which a hardmask is used in patterning ultra narrow polysilicon, or amorphous silicon, lines. Since the hardmask is not compatible with the salicide process, it must be removed. In removing the hardmask it is important to insure that other regions; such as, the silicon substrate, the polysilicon gate sidewall and the shallow trench insulation; are not damaged. Such damage would impact the yield and reliability of the product.

The conventional approach involves a seven step process. After the polysilicon gate patterning step there exist regions of silicon, polysilicon gate covered with a hardmask and shallow trench insulation (assuming this to be the isolation scheme, for example). An overall buffer layer is deposited and, in the third step, etched back to expose the hardmask. Following removal of the hardmask, using a selective removal method, the remaining buffer material is removed by an O2 plasma asher followed by a wet cleaning step, such as an RCA bath. Finally, the seventh step involves salicide formation.

FIGS. 2A–2F schematically shows the salicide process flow when the conventional approach is used. After patterning the polysilicon gate, FIG. 2A, a buffer layer, photoresist for example, is deposited, FIG. 2B, as in the process flow according to the present invention. A partial ashing is then performed to expose the hardmask, FIG. 2C. The fourth step is hardmask removal, FIG. 2D. This is accomplished in various ways for the different hardmasks. Generally, a different tool is required than that used to partially remove the buffer layer. Dry or wet etching or chemical and mechanical polishing are removal methods conventionally used. Different methods are used for the common hardmask materials; SiON, Si3N4 and various forms of SiO2; since not all methods work equally well for the different hardmasks. Damage is likely in any of these methods. Next, the remaining buffer layer is removed, commonly by O2 asher, and the sixth step is a Caro's cleaning step to prepare the wafer for salicide formation, the seventh step, FIG. 2F.

SUMMARY OF THE INVENTION

It is a primary objective of this invention to provide a more efficient and reliable salicide process flow. It is also a primary objective to provide an in-situ method for removal of hardmask and buffer layers. Partial ashing, to expose the hardmask, hardmask removal and buffer layer removal are accomplished in one etcher or asher.

The process disclosed by the present invention has the distinct advantage of containing only five steps to accomplish the same result. In addition, the method of the present invention results in less damage to the gate sidewall, silicon substrate and shallow trench isolation. Another advantage is that the method of the present invention is applicable without alteration for many hardmask materials, whereas in the conventional method different removal methods are generally required for different hardmask materials.

In accordance with the objectives of the invention, a method is achieved for removing a hardmask from a feature on a semiconductor wafer. The method comprises the following phases: depositing a buffer layer overall; etching back the buffer layer in an etching apparatus to expose the hardmask; etching the hardmask in the etching apparatus; and etching of the remaining buffer layer in the etching apparatus.

BRIEF DESCRIPTION OF THE DRAWINGS

In the accompanying drawings forming a material part of this description, there is shown:

FIGS. 1A–1D are cross-sectional representations of the invention.

FIGS. 2A–2F are cross-sectional representations of the prior art.

FIG. 3 shows a cross-sectional representation of an FET and adjacent shallow trench isolation.

DESCRIPTION OF THE PREFERRED EMBODIMENTS

Referring to FIG. 1A, there is shown a part of a wafer after gate patterning. Regions 10, 12, 14 and 16 are the hardmask, gate, substrate and shallow trench insulation, respectively. The hardmask could be made of various materials; for example, SiON, Si3N4 or SiO2. In the preferred embodiment described here the hardmask is SION of between about 240 and 360 Å thick. Modifications required for hardmasks of another material or different thickness will be clear to those skilled in the art. The gate, 12, and substrate, 14, are polysilicon and silicon, respectively, in this preferred embodiment because these materials are prevalent for the gate and substrate and also because these materials are required in the salidation process. Typical dimensions for the polysilicon gate are between about 1600 and 2400 Å high and about a quarter to one micron wide.

Some details of the polysilicon gate and silicon substrate, regions 12 and 14, respectively, omitted for the sake of clarity in FIGS. 1 and 2, are shown in FIG. 3. Here, region 20 is the gate oxide, region 22 is a sidewall spacer needed to prevent shorting of the gate to the source and drain during silicidation and region 24 constitutes the source and drain. The gate oxide thickness is typically between about 40 and 50 Å.

With such small dimensions for the gate and gate oxide, the achievement of acceptable yield and reliability requires that only a minimum of damage occurs in the process of hardmask removal. This invention provides a novel method to remove the hardmask, that is depicted schematically in FIG. 1, which is simpler, more economical and more reliable than the conventional method, schematically shown in FIG. 2.

In order to remove the hardmask 10, without attacking the shallow trench insulation, 16, gate oxide, sidewall spacer and silicon substrate, a buffer layer is applied overall. This buffer layer could be photoresist, BARC, low k spin-on or other such material that has good gap filling capability and can be removed by O2 plasma etch. Typically, it would be photoresist and in these embodiments this layer is taken to be about 4000–6000 Å DUV photoresist. Those skilled in the art can readily apply the methods described to other materials and other thickness.

After deposition of the buffer layer, the situation is as depicted in FIG. 1 B. It is now required to perform the following: (1) etch back the buffer layer to expose the hardmask, (2) remove the hardmask and (3) strip the remaining buffer material. It is important not to expose the gate in etching back the buffer so that the gate is not attacked during hardmask removal. The buffer etching techniques used need to be benign to oxide and silicon. Compromising the gate sidewall oxide could lead to shorting of the gate to the source or drain during salicide formation. Gate oxides of dimension considered here are extremely susceptible to shorts so that any damage is a potential problem. Shallow trenches, filled with oxide or other insulator for device isolation, could become leaky. Silicon damage can result in leaky junctions. It is also important to reduce handling as much as possible since handling often contributes to yield and reliability problems.

Accordingly, in a most preferred embodiment of this invention the above three tasks are performed in-situ, in a single remote downstream plasma etcher or asher. In a downstream plasma etcher the wafer is placed in a downstream process chamber to completely eliminate ion bombardment. The etching is strictly chemical and isotropic. With is no ion bombardment there is no ion-induced damage or charging. Different materials are etched by adjusting the chemicals in the gas flow. Hardmask removal is achieved with only minimal damage when the methods of this invention are used.

The particulars of a preferred embodiment are given for a DUV photoresist layer of between about 4000 and 6000 Å, an SiON hardmask between about 240 and 360 Å thick, a polysilicon gate between 1600 and 3600 Å thick and a gate oxide between 40 and 60 Å thick. Those skilled in the art will readily apply the methods to other dimensions and materials. The details are:

(1) Photoresist etch back with end point control.
Operating conditions of the remote plasma chemical downstream etcher: pressure, 24 to 36 mt; top power, 400 to 600 tcp; bias power, 120 to 180 watts; gas and flow rate, O2 80 to 120 sccm/C2F6 24 to 36 sccm/Ar 160 to 240 sccm; 16 to 24 torr backside helium; processing time is between about 25 to 31 seconds, etching is actually stopped when it is determined that the hardmask is exposed.

(2) Hardmask removal.
Operating conditions of the remote plasma chemical downstream etcher: pressure, 2.4 to 3.6 mt; top power, 400 to 600 tcp; bias power, 800 to 1200 watts; gas and flow rate, C4F8 6.4 to 9.6 sccm/C2F6 12 to 18 sccm/Ar 160 to 240 sccm; 16 to 24 torr backside helium; processing time is between about 8 to 12 seconds.

(3) Buffer layer removal.
Operating conditions of the remote plasma chemical downstream etcher: pressure, 12 to 18 mt; top power, 800 to 1200 tcp; bias power, 160 to 240 watts; gas and flow rate, O2 600 to 900 sccm; 16 to 24 torr backside helium; processing time is about 8 to 12 seconds.

After buffer layer removal, the next step is to subject the wafer to a deionized water rinse, which cleans the surface in preparation of salicide formation. At this point the situation is as depicted in FIG. 1C.

The fifth, and final, step is to form the salicide. A blanket layer of appropriate metal, for example titanium, is deposited and the wafer is heated in a nitrogen environment. Where the metal is in contact with silicon a reaction takes place and silicide is formed. For the structure being considered, this occurs on the surface of the silicon substrate and on the top surface of the polysilicon gate. Finally, when the unreacted metal is removed, silicide remains only where it is needed for contact to the source, drain and gate; as is shown in FIG. 1D.

Another preferred embodiment relates to an in-situ method of hardmask removal by a single etcher or a single asher. The hardmask could have been used in patterning or masking any feature, not necessarily polysilicon gates. Removal of the hardmask according to the present invention follows the recipe given above starting with the deposition of a buffer layer overall. Next the buffer layer is partially etched, using a remote plasma chemical downstream etcher, to expose the hardmask. Hardmask removal follows, and is accomplish in the same etcher, changing only the operating conditions. Finally, the remaining buffer layer is removed, again in the same etcher adjusting the operating conditions. Operating conditions of a remote plasma chemical etcher for partial etchback, hardmask removal and buffer layer removal are specified above for a deep ultraviolet photoresist buffer layer and a SiON hardmask.

While the invention has been particularly shown and described with reference to the preferred embodiments thereof it will be understood by those skilled in the art that various changes in form and details may be made without departing from the spirit and scope of the invention.

What is claimed is:

1. A method of removing a hardmask from a feature on a semiconductor wafer, comprising:

a) providing the hardmask over a patterned feature on a semiconductor substrate;

b) depositing a buffer layer over the hardmask and substrate;

c) etching back said buffer layer in an etching apparatus to expose said hardmask;

d) removing said hardmask in said etching apparatus; and e) etching of remaining said buffer layer in said etching apparatus.

2. The method of claim 1 wherein said feature comprises patterned metal regions.

3. The method of claim 1 wherein said feature comprises patterned silicon regions.

4. The method of claim 1 wherein said feature comprises patterned polysilicon regions.

5. The method of claim 1 wherein said buffer layer comprises photoresist.

6. The method of claim 1 wherein said buffer layer comprises bottom antireflective coating.

7. The method of claim 1 wherein said buffer layer comprises low dielectric constant spin-on glass.

8. The method of claim 1 wherein the hardmask comprises SiON.

9. The method of claim 1 wherein the hardmask comprises Si3N4.

10. The method of claim 1 wherein the hardmask comprises SiO2.

11. The method of claim 1 wherein said etching apparatus comprises a remote plasma chemical downstream etcher.

12. The method of claim 1 wherein the gas flowing in said etching apparatus for said buffer etchback phase comprises O2/C2F6/Ar.

13. The method of claim 1 wherein the gas flowing in said etching apparatus for said hardmask removal phase comprises C2F6/C4F8/Ar.

14. The method of claim 1 wherein the gas flowing in said etching apparatus for said buffer removal phase comprises O2.

15. A method of forming salicide comprising the steps of:
 a) patterning polysilicon gates, over a semiconductor substrate, using a hardmask;
 b) depositing a buffer layer over said polysilicon gates and substrate;
 c) etching back the buffer layer in an etching apparatus partially, removing the hardmask in the etching apparatus and removing the buffer layer in said etching apparatus removal;
 d) rinsing in deionized water;
 e) depositing a metal layer, promoting silicidation reaction where metal and silicon are in contact and removing unreacted metal.

16. The method of claim 15 wherein said hardmask comprises SiON.

17. The method of claim 15 wherein said hardmask comprises Si3N4.

18. The method of claim 15 wherein said hardmask comprises SiO2.

19. The method of claim 15 wherein said buffer layer comprises photoresist.

20. The method of claim 15 wherein said buffer layer comprises bottom antireflective coating.

21. The method of claim 15 wherein said buffer layer comprises low dielectric constant spin-on glass.

22. The method of claim 15 wherein said partial buffer layer etch back comprises O2 ashing.

23. The method of claim 15 wherein the etching apparatus is a remote chemical downstream etcher.

24. The method of claim 15 wherein said partial etchback comprises etching where the gas is O2/C2F6/Ar.

25. The method of claim 15 wherein said hardmask removal comprises dry etching.

26. The method of claim 15 wherein said hardmask removal comprises etching where the gas is C4F8/C2F6/Ar.

27. The method of claim 15 wherein said hardmask removal comprises wet etching.

28. The method of claim 15 wherein said hardmask removal comprises chemical mechanical polishing.

29. The method of claim 15 wherein the said buffer layer removal comprises O2 ashing.

* * * * *